United States Patent
Liu et al.

(10) Patent No.: US 12,057,261 B1
(45) Date of Patent: Aug. 6, 2024

(54) HEAT-RESISTANT NANOCRYSTALLINE MAGNETIC-ISOLATION SHIELDING MATERIAL AND PREPARATION METHOD AND APPLICATION THEREOF

(71) Applicant: HANGZHOU QUADRANT TECHNOLOGY CO., LTD., Zhejiang (CN)

(72) Inventors: Zhijian Liu, Zhejiang (CN); Chengliang Ni, Zhejiang (CN); Li Feng, Zhejiang (CN); Guwei Wang, Zhejiang (CN); Dan Xia, Zhejiang (CN)

(73) Assignee: HANGZHOU QUADRANT TECHNOLOGY CO., LTD., Zhejiang (CN)

( * ) Notice: Subject to any disclaimer, the term of this patent is extended or adjusted under 35 U.S.C. 154(b) by 0 days.

(21) Appl. No.: 18/420,943

(22) Filed: Jan. 24, 2024

(30) Foreign Application Priority Data

Dec. 11, 2023 (CN) .......................... 202311687762.9

(51) Int. Cl.
*H01F 41/02* (2006.01)
*B32B 3/30* (2006.01)
(Continued)

(52) U.S. Cl.
CPC ............ *H01F 41/0253* (2013.01); *B32B 3/30* (2013.01); *B32B 7/12* (2013.01); *B32B 15/09* (2013.01);
(Continued)

(58) Field of Classification Search
CPC ......... H01F 41/0253; B32B 3/30; B32B 7/12; B32B 15/09; B32B 27/36; B32B 37/06;
(Continued)

(56) References Cited

FOREIGN PATENT DOCUMENTS

| CN | 102172556 A | 9/2011 |
|----|-------------|--------|
| CN | 203108925 U | 8/2013 |

(Continued)

OTHER PUBLICATIONS

Machine translation.*

*Primary Examiner* — Vishal I Patel
(74) *Attorney, Agent, or Firm* — Cooper Legal Group, LLC

(57) ABSTRACT

The present application relates to the technical field of electromagnetic-isolation shielding materials, and in particular to a heat-resistant nanocrystalline magnetic-isolation shielding material and a preparation method and application thereof. The preparation method includes the following steps: S1, applying a double-sided adhesive tape onto a nanocrystalline soft-magnetic alloy ribbon to prepare a adhesive-coated nanocrystalline ribbon; S2, performing primary magnet cracking treatment on the adhesive-coated nanocrystalline ribbon to obtain a single-layered nanocrystalline magnetic layer; S3, performing multi-layer combination on the single-layered nanocrystalline magnetic layer to obtain a composite, and performing stress relief treatment on the composite to obtain a multi-layered nanocrystalline magnetic layer; and S4: performing secondary magnet cracking treatment on the multi-layered nanocrystalline magnetic layer to obtain a heat-resistant nanocrystalline magnetic-isolation shielding material.

8 Claims, 2 Drawing Sheets

(51) Int. Cl.
  *B32B 7/12*   (2006.01)
  *B32B 15/09*  (2006.01)
  *B32B 27/36*  (2006.01)
  *B32B 37/06*  (2006.01)
  *B32B 37/12*  (2006.01)
  *H01F 7/02*   (2006.01)
  *H05K 9/00*   (2006.01)

(52) U.S. Cl.
  CPC .............. *B32B 27/36* (2013.01); *B32B 37/06* (2013.01); *B32B 37/1284* (2013.01); *H01F 7/02* (2013.01); *H05K 9/0075* (2013.01); *B32B 2307/208* (2013.01); *B32B 2307/212* (2013.01); *B32B 2307/7376* (2023.05); *B32B 2309/02* (2013.01); *B32B 2309/04* (2013.01); *B32B 2333/08* (2013.01); *B32B 2367/00* (2013.01)

(58) Field of Classification Search
  CPC ........ B32B 37/1284; B32B 2307/7376; B32B 2307/208; B32B 2307/212; B32B 2309/02; B32B 2309/04; B32B 2333/08; B32B 2367/00; H05K 9/0075

See application file for complete search history.

(56) References Cited

FOREIGN PATENT DOCUMENTS

| | | | | |
|---|---|---|---|---|
| CN | 104011814 | A | 8/2014 | |
| CN | 104900383 | A | 9/2015 | |
| CN | 109727742 | A | 5/2019 | |
| CN | 109817442 | A | 5/2019 | |
| CN | 110364340 | A | 10/2019 | |
| CN | 213752192 | U | 7/2021 | |
| CN | 113284690 | A | 8/2021 | |
| CN | 113388721 | A | 9/2021 | |
| CN | 114551053 | A | 5/2022 | |
| CN | 115474420 | A | 12/2022 | |
| KR | 102525700 | B1 * | 4/2023 | ............. H01F 10/20 |
| WO | 2020171430 | A1 | 8/2020 | |
| WO | WO-2022247062 | A1 * | 12/2022 | ............. C22C 45/02 |

* cited by examiner

HEAT-RESISTANT NANOCRYSTALLINE MAGNETIC-ISOLATION SHIELDING MATERIAL AND PREPARATION METHOD AND APPLICATION THEREOF

CROSS-REFERENCE TO RELATED APPLICATION

The present application is based on and claims the priority benefits of China application No. 202311687762.9, filed on Dec. 11, 2023. The entirety of China application No. 202311687762.9 is hereby incorporated by reference herein and made a part of this specification.

TECHNICAL FIELD

The present application relates to the technical field of electromagnetic-isolation shielding materials, and in particular to a heat-resistant nanocrystalline magnetic-isolation shielding material and a preparation method and application thereof.

BACKGROUND

In recent years, with the development of consumer electronic products toward high-frequency, small-sized, and light and thin products, there is an urgent need to develop advanced magnetic isolation shielding materials to solve complex electromagnetic interference problems, especially in some working environments that are far above normal temperatures. These environments result in large fluctuations in the performance of existing magnetic-isolation shielding materials, which in turn affects the performance stability and service life of electronic products. For example, the induction heating temperature of e-cigarettes usually reaches 200° C. to 300° C. In order to improve efficiency, some terminals are designed to operate at the MHz level, which places extremely high requirements on the high-temperature performance stability of magnetic-isolation shielding materials. For another example, drones will produce relatively complex electromagnetic interference due to their large operating current and rapid changes, and the temperature in local areas of the system will reach 200° C. or above in a short time. Ordinary magnetic-isolation shielding materials are prone to deformation and bulging, with large fluctuations in inductance and resistance, which may affect the sensor. More seriously, it will interfere with the flight status and positioning accuracy. Therefore, in order to meet the demand for high-quality and high-stability electronic products, the development of heat-resistant magnetic shielding materials with stable performance at working ambient temperatures above 200° C. has become a new development direction.

At present, nanocrystalline shielding materials have a wider frequency application range, thinner thickness, lower loss, conveniently adjustable magnetic permeability, easy processing and other excellent properties. They are currently the mainstream magnetic-isolation shielding materials used in electronic products, have been widely used in wireless charging of smartphones, smart wearables and other products, as well as electromagnetic shielding of consumer electronic products. The shielding material is made by combining a double-sided adhesive tape and a nanocrystalline ribbon into a single layer or multiple layers. All double-sided adhesive tapes used are basically acrylic adhesives. This kind of adhesive generally has a temperature resistance of 90° C. to 120° C. For electronic products with low power and normal-temperature working environment, there is no problem in its application. However, for some special electronic products that work in high-frequency or high-current or high-temperature environments, such as e-cigarettes, drones and other devices, the local ambient operating temperature can reach 200° C. or above in a short time. Nanocrystalline shielding materials prepared using ordinary acrylic glue and traditional nanocrystalline shielding sheet technologies will have unstable performance. Patent CN104011814A discloses a magnetic field shielding sheet for wireless chargers, including: at least one layer of thin magnetic sheet, formed of an amorphous ribbon separated into multiple fine fragments; a protective film bonded to one side of the thin magnetic sheet through a first adhesive layer; and a double-sided adhesive tape bonded to the other side of the thin magnetic sheet through a second adhesive layer arranged on one side of the double-sided adhesive tape. The thickness of the adhesive layer described in the patent needs to be greater than 50% of the nanocrystalline thickness, and is preferably 10/20/30 um. This kind of double-sided adhesive tape has obvious disadvantages in high-temperature environments, and the thicker it is, the more unstable its performance is. Patent CN104900383A discloses a single-layer/multi-layer magnetic conductive sheet for wireless charging and a preparation method thereof. As described in this patent, thin sheets are insulated by way of glue dipping, thereby improving the charging efficiency. By one-side glue dipping, glue fills cracks in the ribbon and it is ensured that the cracks are completely filled. In the meanwhile, each bare area of all small units of an amorphous or nanocrystalline sheet is coated so that the bare areas are insulated, thereby reducing eddy current losses. Patent CN110364340A discloses a magnetic isolation sheet and a preparation method and application thereof. Gaps between the cracks of the magnetic isolation sheet described in the patent are filled with an insulating glue layer to insulate fragment units on both sides of the crack from each other. By dipping the ribbon into insulating glue, two sides of the magnetic isolation sheet have insulating glue layers to obtain a magnetic isolation sheet with good insulation effect. According to the above two patents, regardless of single-sided dipping or double-sided dipping, because the nanocrystalline ribbon is very brittle and fragile after heat treatment, it is difficult to achieve continuous mass production in industrial production, and it is also extremely difficult to control the continuity of production, so this process has not yet been used in large-scale production. Patent CN114551053A discloses a nanocrystalline magnetic isolation sheet for an electromagnetic induction heating electronic cigarette and a preparation and application thereof. As disclosed in the patent, the initial magnetic permeability of the nanocrystalline magnetic isolation sheet ranges from 200 to 2000 at a frequency of 100 kHz, so that the nanocrystalline magnetic isolation sheet can effectively coat an electromagnetic induction heating coil, thereby achieving very good magnetic isolation effect and heating effect. However, the electromagnetic induction heating systems of some e-cigarette products operate at the MHz level, which places extremely high requirements on magnetic loss at high frequencies and high-temperature stability of the magnetic sheets. The patent only discloses the performance at 100 kHz and cannot guarantee the performance stability and applicability of the magnetic isolation sheet at MHz frequencies.

Therefore, it is of great value to develop a magnetic isolation sheet that can be used in high-temperature working environments and can be used in fields such as electronic cigarettes, drones, and robots that operate at high frequencies or large currents.

SUMMARY

In order to address the defects and shortcomings of existing magnetic isolation products, the present application provides a heat-resistant nanocrystalline magnetic-isolation shielding material and a preparation method thereof. The heat-resistant nanocrystalline magnetic-isolation shielding material is obtained by coating a nanocrystalline soft magnetic alloy ribbon with an ultra-thin double-sided adhesive tape in combination with subsequent processes such as primary magnet cracking treatment, stress relief treatment and secondary magnet cracking treatment. The heat-resistant nanocrystalline magnetic-isolation shielding material has stable performance in a high-temperature environment.

In view of this, a first aspect of the present application provides a preparation method of a heat-resistant nanocrystalline magnetic-isolation shielding material. The method includes the following steps:

S1, applying a double-sided adhesive tape onto a nanocrystalline soft-magnetic alloy ribbon to prepare an adhesive-coated nanocrystalline ribbon;

S2, performing primary magnet cracking treatment on the adhesive-coated nanocrystalline ribbon to obtain a single-layered nanocrystalline magnetic layer;

S3, performing multi-layer combination on the single-layered nanocrystalline magnetic layer to obtain a composite, and performing stress relief treatment on the composite to obtain a multi-layered nanocrystalline magnetic layer; and S4: performing secondary magnet cracking treatment on the multi-layered nanocrystalline magnetic layer to obtain a heat-resistant nanocrystalline magnetic-isolation shielding material.

During the preparation process of the heat-resistant nanocrystalline magnetic-isolation shielding material described herein, after the primary magnet cracking treatment is carried out on the adhesive-coated nanocrystalline ribbon, stress relief treatment and secondary magnet cracking treatment are further introduced, so that the heat-resistant nanocrystalline magnetic-isolation shielding material has better thermal stability, which greatly improves the stability of magnetic devices working in high-temperature environments.

The nanocrystalline soft magnetic alloy ribbon used in step S1 of the present application can be produced by heat-treating an amorphous soft magnetic alloy ribbon. Before heat treatment, the amorphous soft magnetic alloy ribbon can be cut into sheets or rolled into a ring-shaped iron core, which facilitates the continuous preparation of the heat-resistant nanocrystalline magnetic-isolation shielding material. In the present application, the amorphous soft magnetic alloy ribbon is heat-treated at a temperature of 500° C. to 600° C., for example, at 500° C., 520° ° C., 550° C., 580° C., 600° C., or the like, preferably at a temperature within a range of 550° C. to 580° ° C., in an inert atmosphere or in vacuum, preferably in a nitrogen atmosphere.

In the present application, the amorphous soft magnetic alloy ribbon may be an iron-based amorphous soft magnetic alloy ribbon or a cobalt-based amorphous soft magnetic alloy ribbon. The present application does not clearly limit the elemental composition of the iron-based amorphous soft magnetic alloy ribbon or cobalt-based amorphous soft magnetic alloy ribbon used, and those skilled in the art can obtain it by purchasing commercially available products.

In some embodiments, in step S1, the double-sided adhesive tape is a double-sided adhesive tape without a base material or a double-sided adhesive tape with a base material, and the base material in the double-sided adhesive tape with a base material is a PET film with a thickness of no more than 1.9 μm.

In the present application, the double-sided adhesive tape used may be a double-sided adhesive tape without a base material or a double-sided adhesive tape with a base material. It is found through research that compared with magnetic isolation sheets prepared using a double-sided adhesive tape with a base material, the magnetic isolation sheet (magnetic-isolation shielding material) prepared using a double-sided adhesive tape without a base material by the method described herein can also effectively reduce performance fluctuations after high-temperature storage, and its performance fluctuations are smaller. Compared with magnetic isolation sheets prepared using a double-sided adhesive tape with a base material, for controlling the same magnetic permeability, the magnetic isolation sheet prepared using a double-sided adhesive tape without a base material has slightly larger magnetic loss.

In the present application, the base material in the double-sided adhesive tape with a base material is a PET (polyethylene terephthalate) film. The base material is prone to deformation and has high flexibility, which is convenient for subsequent processing. Moreover, with good heat resistance a low dielectric loss, the base material helps to further improve the comprehensive performance of the prepared heat-resistant nanocrystalline magnetic-isolation shielding material. In the present application, the thickness of the base material is not greater than 1.9 μm, preferably within a range of 1.0 μm to 1.9 μm, for example, it may be 1.4 μm or 1.9 μm, and preferably 1.4 μm. The thickness of the base material in the present application has a great influence on the high-temperature stability of the prepared heat-resistant nanocrystalline magnetic-isolation shielding material. After thermal shock test, it is found that the magnetic performance stability of the magnetic isolation sheet prepared using a double-sided adhesive tape with a 1.4 μm base material is significantly better than that of a magnetic isolation sheet prepared using a double-sided adhesive tape with a 1.9 μm base material.

In some embodiments, a thickness of an adhesive layer in the double-sided adhesive tape ranges from 3 μm to 30 μm, an adhesive in the adhesive layer is an acrylic adhesive or a modified acrylic adhesive, and the modified acrylic adhesive is an acrylic adhesive modified by a bismethylsilane coupling agent.

In the present application, the thickness of the adhesive layer in the double-sided adhesive tape may be 3 μm, 5 μm, 8 μm, 10 μm, 15 μm, 20 μm, 25 μm, 30 μm, or the like. In some preferred embodiments, the thickness of the adhesive layer in the double-sided adhesive tape is within a range of 3 μm to 8 μm, for example, 3 μm. Since the double-sided adhesive tape has obvious disadvantages in high-temperature environments, and the thicker it is, the more unstable its performance is. The double-sided adhesive layer used in the present application is relatively thin, so as to avoid the influence of an excessively thick adhesive layer on the thermal stability of the prepared magnetic isolation sheet.

In the present application, the adhesive in the double-sided adhesive layer may be an ordinary acrylic adhesive, or a modified acrylic adhesive with high heat resistance, preferably a modified acrylic adhesive. The modified acrylic adhesive is an acrylic adhesive modified with a bismethylsilane coupling agent as a heat-resistant monomer. Since stress relief treatment and secondary magnet cracking treatment procedures are further introduced during the preparation process of the heat-resistant nanocrystalline magnetic-isolation shielding material described herein, even if ordinary acrylic adhesives with poor heat resistance are used in the present application, the magnetic-isolation shielding materials produced can have good thermal stability, but the use of modified acrylic adhesives can further improve the high-temperature storage stability of the magnetic-isolation shielding materials. The double-sided adhesive tape used in the present application is a commercially available product, and those skilled in the art can purchase and use it as needed.

In some embodiments, in step S2, the primary magnet cracking treatment is implemented by way of longitudinal and transverse cross-roller shearing or by way of rolling with an anilox roller with raised points, roller scissors in the cross-roller shearing has a blade gap of 1 mm to 1.5 mm, and the size of the raised points on the anilox roller ranges from 1 mm to 1.5 mm.

In the present application, by the primary magnet cracking treatment described above, the size of nanocrystalline fragment units in the obtained single-layered nanocrystalline magnetic layer ranges from 0.3 mm to 1.5 mm, and the magnetic loss of the obtained magnetic-isolation shielding material can be reduced and its thermal stability can be improved.

The primary magnet cracking treatment in the present application may also be carried out after the multi-layer combination carried out on the single-layered nanocrystalline magnetic layer and before the stress relief treatment. The high-temperature stability of the obtained nanocrystalline shielding material is close to that of the nanocrystalline shielding material obtained by performing the primary magnet cracking treatment on the single-layered nanocrystalline magnetic layer before multi-layer combination and can basically meet the requirements, but the time for the primary magnet cracking treatment process will be increased significantly.

In some embodiments, in step S1, a thickness of the nanocrystalline soft magnetic alloy ribbon ranges from 12 μm to 22 μm.

In some specific embodiments, the thickness of the nanocrystalline soft magnetic alloy ribbon may be 12 μm, 14 μm, 16 μm, 18 μm, 20 μm or 22 μm. In some preferred embodiments, the thickness of the nanocrystalline soft magnetic alloy ribbon ranges from 16 to 18 μm.

In the present application, if the thickness of the nanocrystalline soft magnetic alloy ribbon is too small, the mechanical strength of the alloy ribbon will be low, and if the thickness is too high, the performance of the alloy ribbon will be degraded. It is found through research that using nanocrystalline soft magnetic alloy ribbons with a thickness of 16 μm to 18 μm can result in smaller performance fluctuations of the prepared magnetic-insulation shielding materials after high-temperature storage. The width of the nanocrystalline soft magnetic alloy ribbon is not specially limited in the present application and it may be within a range of 5 mm to 300 mm.

In some embodiments, in step S3, the number of single-layered nanocrystalline magnetic layers combined during the multi-layer combination is 2 to 4, and the prepared multi-layered nanocrystalline magnetic layer has a thickness of 30 μm to 120 μm.

In the present application, the thickness of the single-layered nanocrystalline magnetic layer is generally between 18 μm and 32 μm. When the number of single-layered nanocrystalline magnetic layers combined during the multi-layer combination is 2, the double-layered nanocrystalline magnetic layer prepared at this time has a thickness of 30 μm to 65 μm. When the number of single-layered nanocrystalline magnetic layers combined during the multi-layer combination is 3, the three-layered nanocrystalline magnetic layer prepared at this time has a thickness of 45 μm to 90 μm. When the number of single-layered nanocrystalline magnetic layers combined during the multi-layer combination is 4, the four-layered nanocrystalline magnetic layer prepared at this time has a thickness of 60 μm to 120 μm. In the present application, the number of single-layered nanocrystalline magnetic layers combined during the multi-layer combination is 2 to 3 and the thickness of the multi-layered nanocrystalline magnetic layer prepared at this time is more appropriate. In the present application, the schematic diagram of a layered structure of a single-layered nanocrystalline magnetic layer prepared using a double-sided adhesive tape with a base material is shown in FIG. 1. The schematic diagram of a layered structure of a double-layered nanocrystalline magnetic layer prepared using a double-sided adhesive tape with a base material is shown in FIG. 2. The schematic diagram of a layered structure of a three-layered nanocrystalline magnetic layer prepared using a double-sided adhesive tape with a base material is shown in FIG. 3.

In some embodiments, in step S3, the stress relief treatment includes: aging the composite at a temperature of 80° C. to 120° C. for 0.5 h to 24 h.

In some preferred embodiments, the stress relief treatment includes: aging the composite at a temperature of 85° C. to 120° C. for 6 h to 12 h.

By the stress relief treatment described above, the present application can effectively eliminate the stress effect caused by the performance fluctuation of the double-sided adhesive tape on the magnetic fragments when the subsequent magnetic-isolation shielding material is used at a high temperature, thus avoiding changes in magnetic properties caused by stress pulling and effectively improving the thermal stability of the magnetic shielding material at a high temperature.

In some embodiments, the stress relief treatment further includes: performing damp-heat aging on the aged composite at a relative humidity of 75% to 95% and a temperature of 80° ° C. to 100° ° C. for 6 h to 24 h.

In some preferred embodiments, the stress relief treatment further includes: performing damp-heat aging on the aged composite at a relative humidity of 85% and a temperature of 85° C. for 18 h to 24 h.

In the present application, by further performing damp-heat aging on the aged composite, the thermal stability of the magnetic isolation shielding material at a high temperature can be higher.

In some embodiments, in step S4, the secondary magnet cracking treatment is implemented by alternating rolling with a fine-mesh anilox roller with raised points with rolling with a patternless roller, and the size of the raised points on the fine-mesh anilox roller ranges from 0.5 mm to 1 mm.

In the present application, by the secondary magnet cracking treatment described above, the size of fine fragments divided by micro-cracks in the nanocrystal fragment units in the heat-resistant nanocrystalline magnetic-isolation shielding material obtained ranges from 0.01 mm to 0.05 mm. By performing the secondary magnet cracking treatment, the changes in magnetic properties caused by stress pulling at a high temperature can be further eliminated, which helps to further improve the thermal stability of the magnetic-isolation shielding material at a high temperature.

In the present application, the method can carry out large-scale processing such as film coating, primary magnet cracking treatment, multi-layer combination, stress relief treatment, secondary magnet cracking treatment, etc. on continuous nanocrystalline soft magnetic alloy ribbons. It ensures the continuity of the preparation process and is simple to operate, thereby being suitable for industrial production.

A second aspect of the present application provides a heat-resistant nanocrystalline magnetic-isolation shielding material prepared by the method described in the first aspect of the present application.

The present application adopts a combination of primary and secondary magnet cracking treatment processes and stress relief treatment, and selects an appropriate ribbon and double-sided adhesive tape, which not only optimizes the nanocrystalline fragment structure, but also improves the fluctuations of the double-sided adhesive tape under high-temperature shock, thereby reducing the stress effect of the double-sided adhesive tape on the nanocrystalline fragments, effectively reducing eddy current losses and high temperature performance fluctuations, and preparing a heat-resistant nanocrystalline magnetic-isolation shielding material with excellent thermal stability. At a frequency of 6.78 MHz, the magnetic-isolation shielding material has a magnetic permeability $\mu'$ not less than 200 and a magnetic loss $\mu''$ not greater than 100. In addition, under 120° C. high-temperature storage and thermal shock at 200° C., its fluctuations in magnetic properties are small. The magnetic-isolation shielding material can meet the requirements for stable high-temperature performance of electronic products that are prone to heating when operating under a high frequency or a large current.

The heat-resistant magnetic-isolation shielding material produced by the method described in the present application is composed of 2 to 4 layers of nanocrystalline soft magnetic alloy ribbon and a double-sided adhesive tape. The soft magnetic alloy ribbons are broken into uniform lattice-shaped fragment units, and micro-cracks are distributed inside each fragment unit. The size of the lattice-shaped fragment units ranges from 0.3 mm to 1.5 mm, and the size of fine fragments divided by micro-cracks in the fragment units ranges from 0.01 mm to 0.05 mm. The schematic diagram of the magnetic fragment structure on the surface of the prepared heat-resistant nanocrystalline magnetic-isolation shielding material is shown in FIG. 4.

A third aspect of the present application provides an application of the heat-resistant nanocrystalline magnetic-isolation shielding material as described in the second aspect of the present application in preparation of an electromagnetic shielding material for an electronic product that works in a high-temperature environment, and the electronic product is selected from any one of an electronic cigarette, a drone and a robot.

The heat-resistant nanocrystalline magnetic-isolation shielding material provided by the present application has stable magnetic properties when working at a frequency of 6.78 MHz and a temperature of 200° C., which expands the operating temperature and frequency application range of the nanocrystalline shielding material, and thus the nanocrystalline shielding material can be used as an electromagnetic shielding material for an electronic product that needs to work in a high-temperature environment (such as an e-cigarette, a drone and a robot). It should be noted that the heat-resistant nanocrystalline magnetic-isolation shielding material of the present application is also suitable for electromagnetic shielding in a working environment of several hundred kHz and below 200° C.

In the present application, the heat-resistant nanocrystalline magnetic-isolation shielding material may be subjected to multi-layer combination and die-cutting as needed before use.

The beneficial technical effects of the present application are as follows: the preparation method of the heat-resistant nanocrystalline magnetic-isolation shielding material provided by the present application creatively adopts a process of two-stage magnet cracking treatment in combination with stress relief treatment and uses a specific double-sided adhesive tape, which not only optimizes the nanocrystalline fragment structure, but also improves the fluctuations of the double-sided adhesive tape under high-temperature shock, thereby reducing the stress effect of the double-sided adhesive tape on the nanocrystalline fragments, effectively reducing eddy current losses and high-temperature performance fluctuations. The prepared nanocrystalline magnetic-isolation shielding material can still maintain stable magnetic properties without obvious appearance quality defects under working conditions of 180° C. for a long time and 200° ° C. for a short time, thereby achieving a good magnetic isolation and shielding effect. The method of the present application is based on mass-production devices and mass-production processes, is suitable for continuous large-scale production, has practical significance for industrial application, and has good application prospects.

DETAILED DESCRIPTION OF EMBODIMENTS

In order to make the present application easier to understand, the present application will be further described in detail below in conjunction with Examples. These Examples are only for illustrative purposes and do not limit the application scope of the present application. The raw materials or components used in the present application can be prepared by commercial means or conventional methods unless otherwise specified.

In the following Examples, double-sided adhesive tapes using acrylic adhesives are all related double-sided adhesive tapes produced by Tianjin Xingangyuan Hengda Technology Development Co., Ltd. Double-sided adhesive tapes using modified acrylic adhesives are all related double-sided adhesive tapes produced by Green Cosmotec Optoelectronics Technologies Co., Ltd. Iron-based amorphous soft magnetic alloy ribbons are all related ribbons produced by Changde Zhijian New Materials Co., Ltd.

Example 1: Preparation of Heat-Resistant Nanocrystalline Magnetic-Isolation Shielding Material (1) An iron-based amorphous soft magnetic alloy ribbon with a thickness of 20 μm was adopted and rolled into a ring-shaped iron core and then heat-treated at 565° C. in the presence of nitrogen. After annealing, an iron-based nanocrystalline soft magnetic alloy ribbon with a thickness of 20 μm was obtained.

(2) One side of the nanocrystalline ribbon obtained in step (1) was coated with a double-sided adhesive tape having an adhesive layer thickness of 3 μm. The double-sided adhesive tape used was a double-sided adhesive tape with a base material, the adhesive in the adhesive layer was an acrylic adhesive, and the base material was a PET film with a thickness of 1.9 μm. The other side of the nanocrystalline ribbon was a bare surface. A single-coated nanocrystalline ribbon was thus obtained.

(3) Primary magnet cracking treatment was carried out on the single-coated nanocrystalline ribbon obtained in step (2). The primary magnet cracking treatment was implemented by way of longitudinal and transverse cross-roller shearing to obtain a single-layered nanocrystalline magnetic layer. The blade gap of roller scissors in cross-roller shearing was 1.5 mm. The size of nanocrystalline fragments in the single-layered nanocrystalline magnetic layer was about 0.5 mm, making the single-layered nanocrystalline magnetic layer have a magnetic permeability u'=250±50 at a frequency of 6.78 MHz.

(4) Three layers of the single-layered nanocrystalline magnetic layer obtained in step (3) were combined to obtain a composite. The composite was set still in an oven with a temperature of 85° C. for 12 h to have stress relief treatment to obtain a three-layered nanocrystalline magnetic layer with a thickness of 66 μm.

Figure 1:
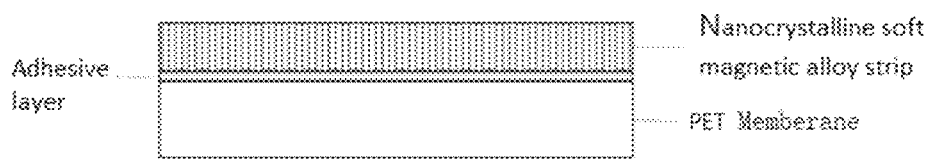
FIG. 1 is a schematic diagram of a layered structure of a single-layered nanocrystalline magnetic layer prepared using a double-sided adhesive tape with a base material according to the present application.
Figure 2:
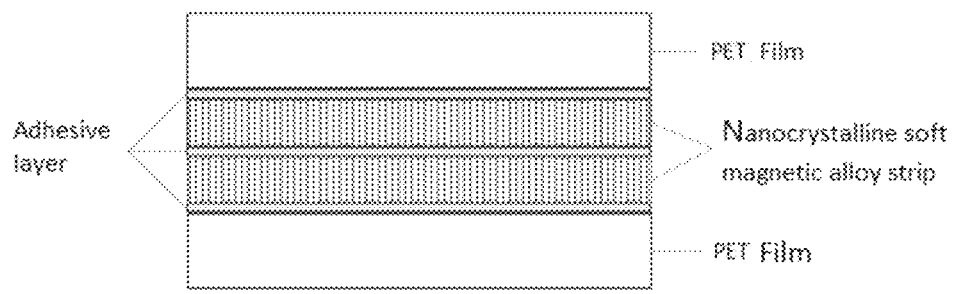
FIG. 2 is a schematic diagram of a layered structure of a double-layered nanocrystalline magnetic layer prepared using a double-sided adhesive tape with a base material according to the present application.
Figure 3:
FIG. 3 is a schematic diagram of a layered structure of a three-layered nanocrystalline magnetic layer prepared using a double-sided adhesive tape with a base material according to the present application.
Figure 4:
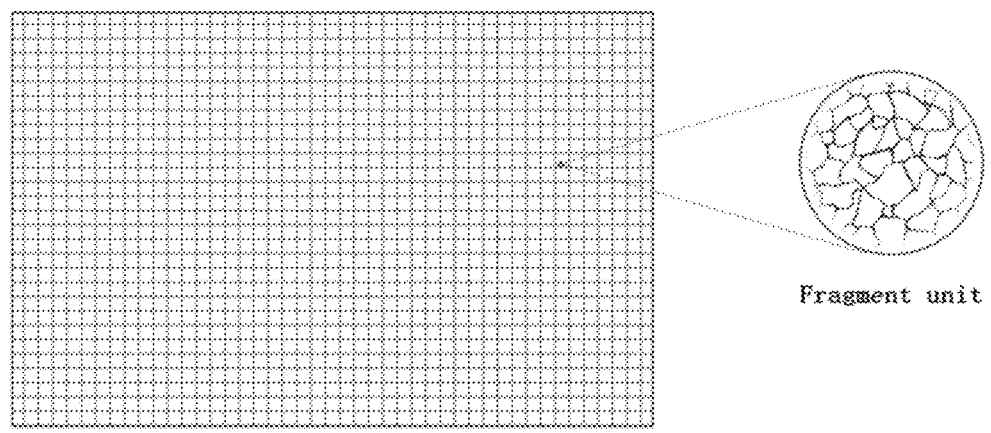
FIG. 4 is a schematic diagram of a magnetic fragment structure on a surface of a prepared heat-resistant nanocrystalline magnetic-isolation shielding material according to the present application.
Figure 5:
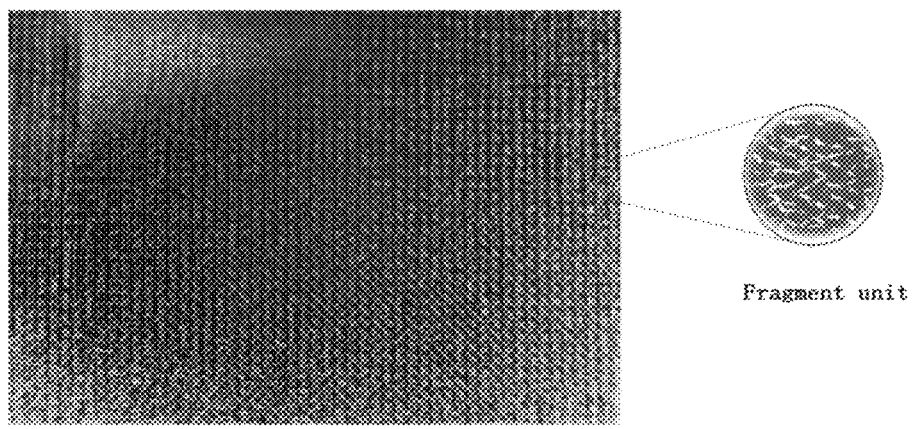
FIG. 5 is a surface fragmented magnetic morphology of the prepared heat-resistant nanocrystalline magnetic-isolation shielding material according to Example 1.

(5) Secondary magnet cracking treatment was carried out on the three-layered nanocrystalline magnetic layer obtained in step (4). The secondary magnet cracking treatment was implemented by way of alternating rolling with a fine-mesh anilox roller with raised points with rolling with a pattern-less roller to obtain a heat-resistant nanocrystalline magnetic-isolation shielding material. The size of raised points on the fine-mesh anilox roller was 0.8 mm. The size of fine fragments divided by micro-cracks in nanocrystalline fragment units in the heat-resistant nanocrystalline magnetic-isolation shielding material was about 0.03 mm, making the heat-resistant nanocrystalline magnetic-isolation shielding material have a magnetic loss μ"<100 at a frequency of 6.78 MHz. The surface fragmented magnetic morphology of the prepared heat-resistant nanocrystalline magnetic-isolation shielding material is shown in FIG. 5.

Example 2: Preparation of Heat-Resistant Nanocrystalline Magnetic-Isolation Shielding Material The preparation process of this Example was basically the same as that of Example 1 except that an iron-based amorphous soft magnetic alloy ribbon with a thickness of 16 μm was adopted and heat-treated, and after annealing, an iron-based nanocrystalline soft magnetic alloy ribbon with a thickness of 16 μm was obtained.

Example 3: Preparation of Heat-Resistant Nanocrystalline Magnetic-Isolation Shielding Material The preparation process of this Example was basically the same as that of Example 2 except that the base material in the double-sided adhesive tape used in the preparation process was a PET film with a thickness of 1.4 μm.

Example 4: Preparation of Heat-Resistant Nanocrystalline Magnetic-Isolation Shielding Material The preparation process of this Example was basically the same as that of Example 2 except that the double-sided adhesive tape used in the preparation process was a double-sided adhesive tape without a base material.

Example 5: Preparation of Heat-Resistant Nanocrystalline Magnetic-Isolation Shielding Material The preparation process of this Example was basically the same as that of Example 2 except that the stress relief treatment in the preparation process was implemented by setting the composite still in an oven with a temperature of 120° C. for 6 h.

Example 6: Preparation of Heat-Resistant Nanocrystalline Magnetic-Isolation Shielding Material The preparation process of this Example was basically the same as that of Example 2 except that the stress relief treatment in the preparation process was implemented by setting the composite still in an oven with a temperature of 120° C. for 6 h and then setting the composite still in a damp-heat oven with a temperature of 85° C. and a relative humidity of 85% RH for 24 h.

Example 7: Preparation of Heat-Resistant Nanocrystalline Magnetic-Isolation Shielding Material The preparation process of this Example was basically the same as that of Example 6 except that the adhesive in the double-sided adhesive tape used in the preparation process was a modified acrylic adhesive (using bismethylsilane coupling agent as a heat-resistant monomer).

Example 8: Preparation of Heat-Resistant Nanocrystalline Magnetic-Isolation Shielding Material (1) An iron-based amorphous soft magnetic alloy ribbon with a thickness of 16 μm was adopted and rolled into a ring-shaped iron core and then heat-treated at 565° C. in the presence of nitrogen. After annealing, an iron-based nanocrystalline soft magnetic alloy ribbon with a thickness of 16 μm was obtained.

(2) One side of the nanocrystalline ribbon obtained in step (1) was coated with a double-sided adhesive tape having an adhesive layer thickness of 30 μm. The double-sided adhesive tape used was an acrylic double-sided adhesive tape without a base material. The other side of the nanocrystalline ribbon was a bare surface. A single-coated nanocrystalline ribbon was thus obtained. Two layers of the single-coated nanocrystalline ribbon were combined into a double-layered nanocrystalline ribbon with a thickness of 45 μm, with one side being bare and the other side being double-sided adhesive.

(3) Primary magnet cracking treatment was carried out on the double-layered nanocrystalline ribbon obtained in step (2). The primary magnet cracking treatment was implemented by way of longitudinal and transverse cross-roller shearing to obtain a double-layered nanocrystalline magnetic layer. The blade gap of the roller scissors in cross-roller shearing was 1.5 mm. The size of the nanocrystalline fragments in the double-layered nanocrystalline magnetic layer was about 0.5 mm, making the double-layered nanocrystalline magnetic layer have a magnetic permeability u'=250=50 at a frequency of 6.78 MHz.

(4) The double-layered nanocrystalline magnetic layer obtained in step (3) was set still in an oven with a temperature of 120° C. for 6 h and then set sill in a damp-heat oven with a temperature of 85° C. and a relative humidity of 85% RH for 24 h to have stress relief treatment. A double-layered nanocrystalline magnetic layer with a thickness of 45 μm, that was subjected to stress relief treatment, was thus obtained.

(5) Secondary magnet cracking treatment was carried out on the double-layered nanocrystalline magnetic layer obtained in step (4). The secondary magnet cracking treatment was implemented by way of alternating rolling with a fine-mesh anilox roller with raised points with rolling with a patternless roller to obtain a heat-resistant nanocrystalline magnetic-isolation shielding material. The size of raised points on the fine-mesh anilox roller was 0.8 mm. The size of fine fragments divided by micro-cracks in nanocrystalline fragment units in the heat-resistant nanocrystalline magnetic-isolation shielding material was about 0.03 mm, making the heat-resistant nanocrystalline magnetic-isolation shielding material have a magnetic loss u"<100 at a frequency of 6.78 MHz.

Comparative Example 1

(1) An iron-based amorphous soft magnetic alloy ribbon with a thickness of 16 μm was adopted and rolled into a ring-shaped iron core and then heat-treated at 565° C. in the presence of nitrogen. After annealing, an iron-based nanocrystalline soft magnetic alloy ribbon with a thickness of 16 μm was obtained.

(2) One side of the nanocrystalline ribbon obtained in step (1) was coated with a double-sided adhesive tape having an adhesive layer thickness of 3 μm. The double-sided adhesive tape used was a double-sided adhesive tape without a base material, and the adhesive in the adhesive layer was an acrylic adhesive. The other side of the nanocrystalline ribbon was a bare surface. A single-coated nanocrystalline ribbon was thus obtained.

(3) Primary magnet cracking treatment was carried out on the single-coated nanocrystalline ribbon obtained in step (2). The primary magnet cracking treatment was implemented by way of longitudinal and transverse cross-roller shearing to obtain a single-layered nanocrystalline magnetic layer. The blade gap of roller scissors in cross-roller shearing was 1.5 mm. The size of nanocrystalline fragments in the single-layered nanocrystalline magnetic layer was about 0.5 mm, making the single-layered nanocrystalline magnetic layer have a magnetic permeability u'=250±50 at a frequency of 6.78 MHz.

(4) Three layers of the single-layered nanocrystalline magnetic layer obtained in step (3) were combined to obtain a nanocrystalline magnetic-isolation shielding material.

Comparative Example 2

(1) An iron-based amorphous soft magnetic alloy ribbon with a thickness of 16 μm was adopted and rolled into a ring-shaped iron core and then heat-treated at 565° C. in the presence of nitrogen. After annealing, an iron-based nanocrystalline soft magnetic alloy ribbon with a thickness of 16 μm was obtained.

(2) One side of the nanocrystalline ribbon obtained in step (1) was coated with a double-sided adhesive tape having an adhesive layer thickness of 3 μm. The double-sided adhesive tape used was a double-sided adhesive tape with a base material, the adhesive in the adhesive layer was an acrylic adhesive, and the base material was a PET film with a thickness of 1.9 μm. The other side of the nanocrystalline ribbon was a bare surface. A single-coated nanocrystalline ribbon was thus obtained.

(3) Primary magnet cracking treatment was carried out on the single-coated nanocrystalline ribbon obtained in step (2). The primary magnet cracking treatment was implemented by way of longitudinal and transverse cross-roller shearing to obtain a single-layered nanocrystalline magnetic layer. The blade gap of roller scissors in cross-roller shearing was 1.5 mm. The size of nanocrystalline fragments in the single-layered nanocrystalline magnetic layer was about 0.5 mm, making the single-layered nanocrystalline magnetic layer have a magnetic permeability u'=250±50 at a frequency of 6.78 MHz.

(4) Three layers of the single-layered nanocrystalline magnetic layer obtained in step (3) were combined to obtain a three-layered nanocrystalline magnetic layer with a thickness of 66 μm.

(5) Secondary magnet cracking treatment was carried out on the three-layered nanocrystalline magnetic layer obtained in step (4). The secondary magnet cracking treatment was implemented by way of alternating rolling with a fine-mesh anilox roller with raised points with rolling with a patternless roller to obtain a nanocrystalline magnetic-isolation shielding material. The size of raised points on the fine-mesh anilox roller was 0.8 mm. The size of fine fragments divided by micro-cracks in nanocrystalline fragment units in the nanocrystalline magnetic-isolation shielding material was about 0.03 mm, making the nanocrystalline magnetic-isolation shielding material have a magnetic loss u"<100 at a frequency of 6.78 MHz.

Test Example 1

The magnetic-isolation shielding materials prepared in Examples 1-8 and Comparative Examples 1-2 were placed in a 120° C. oven and held for 24 h to have a high-temperature storage test. After being taken out and fully cooled, the materials had a magnetic permeability test on a Keysight E4990A impedance analyzer. The results of magnetic permeability test are shown in Table 1 below.

TABLE 1

Results of magnetic permeability test

| | f = 6.78 MHz | | | | | | f = 128 kHz | | | | | |
| --- | --- | --- | --- | --- | --- | --- | --- | --- | --- | --- | --- | --- |
| | Room temperature | | 120° C.-24 h | | Rate of change | | Room temperature | | 120° C.-24 h | | Change | |
| No. | $\mu'$ | $\mu''$ | $\mu'$ | $\mu''$ | $\Delta\mu'$ | $\Delta\mu''$ | $\mu'$ | $\mu''$ | $\mu'$ | $\mu''$ | $\Delta\mu'$ | $\Delta\mu''$ |
| Example 1 | 276 | 90 | 291 | 97 | 5.4% | 7.8% | 341 | 11 | 352 | 11.8 | 3.2% | 7.3% |
| Example 2 | 279 | 89 | 294 | 95 | 5.4% | 6.7% | 345 | 10.8 | 356 | 11.5 | 3.2% | 6.5% |
| Example 3 | 276 | 87 | 286 | 92 | 3.6% | 5.7% | 341 | 8.5 | 350 | 9 | 2.6% | 5.9% |
| Example 4 | 275 | 94 | 284 | 99 | 3.3% | 5.3% | 340 | 8.4 | 348 | 8.8 | 2.4% | 4.8% |
| Example 5 | 277 | 88 | 291 | 93 | 5.1% | 5.7% | 343 | 10.3 | 354 | 10.9 | 3.2% | 5.8% |
| Example 6 | 272 | 86 | 278 | 88 | 2.2% | 2.3% | 338 | 8 | 342 | 8.2 | 1.2% | 2.5% |
| Example 7 | 265 | 88 | 270 | 90 | 1.9% | 2.3% | 319 | 5.8 | 322 | 5.7 | 0.9% | −1.7% |
| Example 8 | 278 | 91 | 295 | 98 | 6.1% | 7.7% | 343 | 10.5 | 357 | 11.4 | 4.1% | 8.6% |
| Comparative Example 1 | 264 | 86 | 332 | 118 | 25.8% | 37.2% | 320 | 9.8 | 353 | 13.6 | 10.3% | 38.8% |
| Comparative Example 2 | 273 | 84 | 335 | 112 | 22.7% | 33.3% | 340 | 9.1 | 372 | 12.1 | 94% | 33.0% |

As can be seen from the results of magnetic permeability test in Table 1, compared with the magnetic-isolation shielding materials prepared in Comparative Examples 1-2, after a 120° C. high-temperature storage test, the magnetic-isolation shielding materials prepared in Examples 1-8 through the two-stage magnet cracking treatment process and stress relief treatment according to the present application have fluctuations in magnetic permeability $\mu'$ and $\mu''$ at the frequency of 6.78 MHz obviously less than the magnetic-isolation shielding materials not subjected to stress relief treatment and not subjected to both stress relief treatment and the secondary magnet cracking treatment.

As can be seen from the comparison of the test results of Examples 6 and 7, the use of the modified acrylic double-sided adhesive tape can further reduce the fluctuations of magnetic properties, and the best stability performance is shown in high-temperature storage; and at the frequency of 128 kHz, the fluctuation of magnetic permeability is smaller. All these indicate that the nanocrystalline magnetic-isolation shielding materials of the present application have very stable magnetic properties under 120° ° C. high-temperature storage and show excellent heat resistance. As can be seen from the comparison of the test results of Examples 1-2, the magnetic-isolation shielding materials prepared by using a thinner 16 μm nanocrystalline soft magnetic alloy ribbon have smaller high-temperature storage performance fluctuations. As can be seen from the comparison of the test results of Examples 2-3, the magnetic-isolation shielding material prepared using a double-sided adhesive tape with a base material thickness of 1.4 μm has better high-temperature stability than the magnetic-isolation shielding material prepared using a double-sided adhesive tape with a base material thickness of 1.9 μm. As can be seen from the comparison of the test results of Examples 2 and 4, the magnetic-isolation shielding material prepared using a double-sided adhesive tape without a base material by the method of the present application can also effectively reduce performance fluctuations in high-temperature storage and its fluctuations are smaller. Differently, compared with the magnetic-isolation shielding material prepared using a double-sided adhesive tape with a base material, for controlling the same magnetic permeability, the magnetic-isolation shielding material prepared using a double-sided adhesive tape without a base material has slightly larger magnetic loss. As can be seen from the test results of Examples 2 and 5-6, as the thermal aging temperature increases from 85° ° C. to 120° C., and after additional damp-heat aging, the magnetic properties of the magnetic-isolation shielding material change very little after high-temperature storage at 120° C. Especially at the frequency of 128 kHz, the magnetic permeability is almost unchanged. As can be seen from the test results of Example 8, the purpose of enhancing high-temperature storage stability can also be achieved by directly combining two layers of nanocrystalline ribbon using a double-sided adhesive tape without a base material and then performing primary magnet cracking treatment on them together, and the magnetic properties can basically meet the requirements; however, the time for magnet cracking treatment process is significantly increased.

The above test results show that the magnetic-isolation shielding materials prepared by the preparation method described in the present application have good high-temperature stability and can meet the requirements of long-term operation in a 120° C. high-temperature environment. The magnetic-isolation shielding materials are especially suitable for application at MHz-level high frequencies and also suitable for application at kHz-level operating frequencies.

Test Example 2

The magnetic-isolation shielding materials prepared in Examples 1-8 and Comparative Examples 1-2 were uniformly cut into 20 mm-wide ribbons, and a section of ribbon was cut out and wound around a q4.5 mm copper rod for multi-layer combination to produce a multi-layer combined nanocrystalline magnetic-isolation shielding material sample. The magnetic-isolation shielding material obtained by three-layer combination (Examples 1-7 and Comparative Examples 1-2) was cut into a length of 80 mm (equivalent to combination of five three-layered nanocrystalline magnetic layers), and the magnetic-isolation shielding material obtained by double-layer combination (Example 8) was cut into a length of 120 mm (equivalent to combination of eight double-layered nanocrystalline magnetic layers). The prepared nanocrystalline magnetic-isolation shielding material samples obtained by multi-layer combination were placed in ovens with a temperature of 150° C. and 200° C. respectively for 30 min one after another to have thermal shock test. After the samples were taken out and fully cooled, the inductance Ls, resistance Rs and Q value of the samples were tested on the Hioki IM3536 precision LCR meter after thermal shock at different temperatures at 6.78 MHz and 128 kHz, and the changes were observed by comparing with test data at room temperature. The test data of the inductance Ls, resistance Rs and Q value of the samples at 6.78 MHz test are shown in Table 2 below. The test data of the inductance Ls, resistance Rs and Q value of the sample at 128 kHz are shown in Table 3 below.

TABLE 2

| No. | Condition | f = 6.78 MHz, U = 1.0 v | | | Change | |
| --- | --- | --- | --- | --- | --- | --- |
| | | Ls (µH) | Rs (mΩ) | Q | ΔLs (µH) | ΔRs (mΩ) |
| Example 1 | Room temperature | 0.1611 | 961.16 | 7.17 | | |
| | Thermal shock at 150° C. | 0.1606 | 997.32 | 6.89 | −0.0005 | 36.16 |
| | Thermal shock at 200° C. | 0.1650 | 1028.63 | 6.87 | 0.0039 | 59.47 |
| Example 2 | Room temperature | 0.1670 | 946.16 | 7.55 | | |
| | Thermal shock at 150° C. | 0.1656 | 976.00 | 7.26 | −0.0014 | 29.84 |
| | Thermal shock at 200° C. | 0.1702 | 998.86 | 7.29 | 0.0032 | 52.7 |
| Example 3 | Room temperature | 0.1532 | 828.00 | 7.92 | | |
| | Thermal shock at 150° C. | 0.1521 | 842.08 | 7.73 | −0.0011 | 14.08 |
| | Thermal shock at 200° C. | 0.1555 | 865.53 | 7.69 | 0.0023 | 37.53 |
| Example 4 | Room temperature | 0.1528 | 889.12 | 7.36 | | |
| | Thermal shock at 150° C. | 0.1518 | 900.65 | 7.20 | −0.0010 | 11.53 |
| | Thermal shock at 200° C. | 0.1543 | 921.21 | 7.17 | 0.0015 | 32.09 |
| Example 5 | Room temperature | 0.1621 | 941.56 | 7.22 | | |
| | Thermal shock at 150° C. | 0.1610 | 965.32 | 7.11 | −0.0011 | 23.76 |
| | Thermal shock at 200° C. | 0.1650 | 988.89 | 7.07 | 0.0029 | 47.33 |
| Example 6 | Room temperature | 0.1380 | 775.38 | 7.62 | | |
| | Thermal shock at 150° C. | 0.1378 | 780.03 | 7.56 | −0.0002 | 4.65 |
| | Thermal shock at 200° C. | 0.1393 | 790.00 | 7.55 | 0.0013 | 14.62 |
| Example 7 | Room temperature | 0.1410 | 892.00 | 6.77 | | |
| | Thermal shock at 150° C. | 0.1405 | 896.08 | 6.71 | −0.0005 | 4.08 |
| | Thermal shock at 200° C. | 0.1415 | 905.04 | 6.68 | 0.0005 | 13.04 |
| Example 8 | Room temperature | 0.1649 | 979.18 | 6.77 | | |
| | Thermal shock at 150° C. | 0.1640 | 1016.61 | 6.63 | −0.0009 | 37.43 |
| | Thermal shock at 200° C. | 0.1671 | 1060.81 | 6.59 | 0.0042 | 61.63 |

TABLE 2-continued

| No. | Condition | f = 6.78 MHz, U = 1.0 v | | | Change | |
|---|---|---|---|---|---|---|
| | | Ls (μH) | Rs (mΩ) | Q | ΔLs (μH) | ΔRs (mΩ) |
| Comparative Example 1 | Room temperature | 0.1532 | 940.00 | 6.98 | | |
| | Thermal shock at 150° C. | 0.1667 | 1032.26 | 6.91 | 0.0135 | 92.26 |
| | Thermal shock at 200° C. | 0.1783 | 1133.56 | 6.73 | 0.0251 | 193.56 |
| Comparative Example 2 | Room temperature | 0.1632 | 940.00 | 7.43 | | |
| | Thermal shock at 150° C. | 0.1761 | 1022.32 | 7.40 | 0.0129 | 82.32 |
| | Thermal shock at 200° C. | 0.1823 | 1112.47 | 6.99 | 0.0191 | 172.47 |

TABLE 3

| No. | Condition | f = 128 kHz, U = 1.0 v | | | Change | |
|---|---|---|---|---|---|---|
| | | Ls (μH) | Rs (mΩ) | Q | ΔLs (μH) | ΔRs (mΩ) |
| Example 1 | Room temperature | 0.1792 | 2.18 | 66 | | |
| | Thermal shock at 150° C. | 0.1812 | 2.21 | 66 | 0.002 | 0.03 |
| | Thermal shock at 200° C. | 0.1852 | 2.24 | 66 | 0.006 | 0.06 |
| Example 2 | Room temperature | 0.1810 | 2.17 | 67 | | |
| | Thermal shock at 150° C. | 0.1826 | 2.20 | 66 | 0.0016 | 0.03 |
| | Thermal shock at 200° C. | 0.1858 | 2.22 | 67 | 0.0048 | 0.05 |
| Example 3 | Room temperature | 0.1729 | 2.05 | 68 | | |
| | Thermal shock at 150° C. | 0.1739 | 2.07 | 67 | 0.0010 | 0.02 |
| | Thermal shock at 200° C. | 0.1766 | 2.10 | 67 | 0.0037 | 0.05 |
| Example 4 | Room temperature | 0.1722 | 2.03 | 68 | | |
| | Thermal shock at 150° C. | 0.1729 | 2.05 | 67 | 0.0007 | 0.02 |
| | Thermal shock at 200° C. | 0.1750 | 2.06 | 68 | 0.0028 | 0.03 |
| Example 5 | Room temperature | 0.1707 | 2.06 | 66 | | |
| | Thermal shock at 150° C. | 0.1721 | 2.08 | 66 | 0.0014 | 0.02 |
| | Thermal shock at 200° C. | 0.1752 | 2.11 | 67 | 0.0045 | 0.05 |
| Example 6 | Room temperature | 0.1504 | 1.85 | 65 | | |
| | Thermal shock at 150° C. | 0.1506 | 1.86 | 65 | 0.0002 | 0.01 |
| | Thermal shock at 200° C. | 0.1511 | 1.86 | 65 | 0.0007 | 0.01 |
| Example 7 | Room temperature | 0.1526 | 2.19 | 56 | | |
| | Thermal shock at 150° C. | 0.1520 | 2.16 | 56 | −0.0006 | −0.03 |
| | Thermal shock at 200° C. | 0.1521 | 2.12 | 57 | −0.0005 | −0.07 |
| Example 8 | Room temperature | 0.1790 | 2.18 | 53 | | |
| | Thermal shock at 150° C. | 0.1812 | 2.22 | 53 | 0.0022 | 0.04 |
| | Thermal shock at 200° C. | 0.1858 | 2.26 | 54 | 0.0068 | 0.08 |
| Comparative Example 1 | Room temperature | 0.1674 | 2.90 | 46 | | |
| | Thermal shock at 150° C. | 0.1731 | 3.06 | 45 | 0.0057 | 0.16 |
| | Thermal shock at 200° C. | 0.1778 | 3.18 | 45 | 0.0104 | 0.28 |
| Comparative Example 2 | Room temperature | 0.1728 | 2.25 | 61 | | |
| | Thermal shock at 150° C. | 0.1776 | 2.38 | 60 | 0.0048 | 0.13 |
| | Thermal shock at 200° C. | 0.1817 | 2.48 | 59 | 0.0089 | 0.23 |

As can be seen from the test results in Table 2 and Table 3, compared with the magnetic-isolation shielding materials prepared in Comparative Examples 1-2, at 6.78 MHz and 128 kHz and after thermal shock at 150° C. the magnetic-isolation shielding materials prepared in Examples 1-8 have very little change in inductance and slight increase in resistance; after thermal shock at 200° ° C., the inductance still changes little, and the resistance is generally greater than that at 150° C.; however, the increased resistance of Examples 1-8 is significantly less than that of Comparative Examples 1-2. It indicates that use of the double-sided adhesive tape with a base material or the double-sided adhesive tape without a base material can always meet the requirements for stable high-temperature magnetic properties of magnetic-isolation shielding materials in view of the method described in the present invention. As can be seen from comparison of the results of Examples 1-2, by using a thinner 16 μm nanocrystalline soft magnetic alloy ribbon, the inductance of the prepared magnetic-isolation shielding material does not change significantly after thermal shock, but the resistance is significantly reduced. As can be seen from comparison of the results of Examples 2-3, after thermal shock, the magnetic property stability of the nanocrystalline magnetic-isolation shielding material prepared using the double-sided adhesive tape with a base material thickness of 1.4 μm is better than that of the nanocrystalline magnetic-isolation shielding material prepared using the double-sided adhesive tape with a base material thickness of 1.9 μm. The base material thickness of the double-sided adhesive tape affects the stability of high-temperature cycles.

To sum up, by optimizing the double-sided adhesive tape and combining the primary and secondary and secondary magnet cracking treatment processes and stress relief treatment, the present application improves the fluctuations of the double-sided adhesive tape under high-temperature shock, reduces the stress effect on the nanocrystalline fragments, and effectively reduces magnetic loss. The prepared heat-resistant nanocrystalline magnetic-isolation shielding material has small fluctuations in magnetic properties under 120° C. high-temperature storage and thermal shock at 200° C. The magnetic-isolation shielding material can meet the requirements for stable high-temperature performance of electronic products that are prone to heating when operating under a high frequency or a large current.

It should be noted that the above-described embodiments are only used to explain the present application and do not constitute any limitation on the present application. The present application has been described with reference to exemplary embodiments, but it is to be understood that the words used therein are descriptive and explanatory rather than limiting. The present application can be modified as specified within the scope of the claims of the present application, and the present invention can be amended without departing from the scope and spirit of the present application. Although the application described therein refers to specific methods, materials and embodiments, the present application is not intended to be limited to the specific examples disclosed therein, but rather the present application extends to all other methods and applications having the same function.

What is claimed is:

1. A preparation method of a heat-resistant nanocrystalline magnetic-isolation shielding material, comprising the following steps:
   S1, applying a double-sided adhesive tape onto a nanocrystalline soft-magnetic alloy ribbon to prepare an adhesive-coated nanocrystalline ribbon;
   S2, performing a primary magnet cracking treatment on the adhesive-coated nanocrystalline ribbon to obtain a single-layered nanocrystalline magnetic layer;
   S3, performing multi-layer combination on the single-layered nanocrystalline magnetic layer and one or more other single-layered nanocrystalline magnetic layers to obtain a composite, and performing stress relief treatment on the composite to obtain a multi-layered nanocrystalline magnetic layer; and
   S4: performing a secondary magnet cracking treatment on the multi-layered nanocrystalline magnetic layer to obtain the heat-resistant nanocrystalline magnetic-isolation shielding material.

2. The method according to claim 1, wherein, in the step S1, the double-sided adhesive tape has a base material or does not have a base material, and the base material is a polyethylene terephthalate (PET) film with a thickness of no more than 1.9 μm.

3. The method according to claim 2, wherein, a thickness of an adhesive layer in the double-sided adhesive tape ranges from 3 μm to 30 μm, an adhesive in the adhesive layer is an acrylic adhesive or a modified acrylic adhesive, and the modified acrylic adhesive is an acrylic adhesive modified by a bismethylsilane coupling agent.

4. The method according to claim 1, wherein, in the step S2, the primary magnet cracking treatment is implemented by longitudinal and transverse cross-roller shearing or by rolling with an anilox roller with raised points, roller scissors for the longitudinal and transverse cross-roller shearing have a blade gap of 1 mm to 1.5 mm, and the raised points on the anilox roller have a size from 1 mm to 1.5 mm.

5. The method according to claim 1, wherein, at least one of:
   in the step S1, a thickness of the nanocrystalline soft-magnetic alloy ribbon ranges from 12 μm to 22 μm; or
   in the step S3, a number of the single-layered nanocrystalline magnetic layers combined during the multi-layer combination is 2 to 4, and the multi-layered nanocrystalline magnetic layer has a thickness of 30 μm to 120 μm.

6. The method according to claim 1, wherein, in the step S3, the stress relief treatment comprises: aging the composite at a temperature of 80° C. to 120° C. for 0.5 h to 24 h to obtain an aged composite.

7. The method according to claim 6, wherein, the stress relief treatment further comprises: performing damp-heat aging on the aged composite at a relative humidity of 75% to 95% and a temperature of 80° C. to 100° C. for 6 h to 24 h.

8. The method according to claim 1, wherein, in the step S4, the secondary magnet cracking treatment is implemented by alternating rolling with a fine-mesh anilox roller with raised points with rolling with a patternless roller, and a size of the raised points on the fine-mesh anilox roller ranges from 0.5 mm to 1 mm.

* * * * *